United States Patent [19]
Ohe

[11] Patent Number: 6,034,566
[45] Date of Patent: Mar. 7, 2000

[54] TUNING AMPLIFIER

[75] Inventor: Tadataka Ohe, Saitama, Japan

[73] Assignee: Takeshi Ikeda, Tokyo, Japan

[21] Appl. No.: 09/051,932

[22] PCT Filed: Mar. 6, 1996

[86] PCT No.: PCT/JP96/00530

§ 371 Date: Jun. 15, 1998

§ 102(e) Date: Jun. 15, 1998

[87] PCT Pub. No.: WO97/17754

PCT Pub. Date: May 15, 1997

[30] Foreign Application Priority Data

Nov. 7, 1995 [JP] Japan .................................. 7-313669
Nov. 7, 1995 [JP] Japan .................................. 7-313670

[51] Int. Cl.[7] ................................................ H03F 3/45
[52] U.S. Cl. .......................................... 330/69; 330/305
[58] Field of Search ........................... 330/305, 69, 107, 330/302, 306, 98, 99, 100, 310

[56] References Cited

U.S. PATENT DOCUMENTS

| | | | |
|---|---|---|---|
| 3,434,070 | 3/1969 | Bartnik et al. | 330/31 |
| 3,972,006 | 7/1976 | Ruegg | 330/107 |
| 4,023,113 | 5/1977 | Mathias | 330/107 |
| 5,886,580 | 3/1999 | Ikeda et al. | 330/293 |

FOREIGN PATENT DOCUMENTS

| | | |
|---|---|---|
| 58-40935 | 3/1983 | Japan . |
| 5-75384 | 9/1991 | Japan . |
| 5-75384 | 3/1993 | Japan . |
| 95/31036 | 11/1995 | WIPO . |
| 95/34953 | 12/1995 | WIPO . |
| 96/04712 | 2/1996 | WIPO . |

*Primary Examiner*—Robert Pascal
*Assistant Examiner*—Henry Choe
*Attorney, Agent, or Firm*—Dellett and Walters

[57] ABSTRACT

A tuning amplifier 1 is provided with two cascade connected phase shifting circuits 10C and 30C and an adding circuit composed of a feedback resistor 70 and input resistor 74. The circuit 10C is constituted of an operational amplifier 12, a resistor 18 one end of which is connected to the inverting input terminal of the amplifier 18, a resistor 20 connected between the inverting input terminal and the output terminal of the amplifier 12, a series circuit which comprises a capacitor 14 and a variable resistor 16 and one end of which is connected to the other end of the resistor 18. The fluctuation of the output amplitude of the circuit 10C is suppressed when the tuning frequency of the circuit 10C is changed because the resistance of the resistors 18 and 20 are equal to each other. When the signal inputted to a voltage dividing circuit composed of resistors 21 and 23 is taken out as an output, the tuning amplifier 1 itself has a gain and the amplitude of the signal is amplified simultaneously with the tuning operation. The phase shifting circuit 30C has the same structure as that of the circuit 10C, and total phase shift by the circuits 10C and 30C is 360° at a prescribed frequency. Therefore, the tuning amplifier 1 outputs only a signal having a prescribed frequency as a tuned signal.

37 Claims, 12 Drawing Sheets

TUNING AMPLIFIER

TECHNICAL FIELD

The present invention relates to a tuning amplifier easy to be integrated, particularly to a tuning amplifier which can make an optional adjustment of tuning frequency and a maximum attenuation without interference to each other.

BACKGROUND OF ART

Various kinds of the tuning amplifiers using active elements and reactance elements have been conventionally proposed and put to practical use.

For example, the tuning amplifier of the prior art utilizing LC resonance is characterized in that when the tuning frequency is adjusted, Q and a gain depending on a LC circuit are varied, and when the maximum attenuation is adjusted, the tuning frequency is varied, and when the maximum attenuation is adjusted, the gain in the tuning frequency is varied. Consequently, in the tuning amplifier of the prior art, it was extremely difficult to adjust the tuning frequency, the gain in the tuning frequency and the maximum attenuation of C1, C2 without interference to each other. Also, it was difficult to form the tuning amplifier capable of adjusting the tuning frequency and the maximum attenuation by an integrated circuit.

DISCLOSURE OF THE INVENTION

It is the object of the present invention to solve the above problems and to provide a tuning amplifier enable to adjust the tuning frequency, the gain of the tuning frequency, the maximum attenuation without interference therebetween, particularly enable to suppress the amplitude fluctuation in case of the tuning frequency is varied.

The tuning amplifier according to the present invention comprises two phase shifting circuits of a full band pass type including a differential amplifier wherein an output is returned to the input side, a voltage dividing circuit interposed into one part of the feedback loop formed by connecting in cascade each of said two phase shifting circuits. The added signal from said adding circuit is applied to the front stage phase shifting circuit of said two phase shifting circuits connected in cascade, the output signal from the subsequent stage phase shifting circuit is applied to said adding circuit as said feedback signal. An AC signal input to said voltage dividing circuit is output as said tuned signal.

The tuning amplifier according to the present invention comprises an adding circuit for adding an input signal applied to one end of an input impedance element and a feedback signal applied to one end of a feedback impedance element, two phase shifting circuits including a differential amplifier wherein one end of a first resistor is connected to the inverting input terminal and an AC signal is applied by way of said first resistor, a first voltage dividing circuit connected to the output terminal of said differential amplifier, a second resistor interposed between the output terminal of said first voltage dividing circuit and the inverting input terminal of said differential amplifier, and a series circuit constituted by a reactance element using a capacitor or an inductor and a third resistor and connected to the other end of said first resistor. The junction point of said third resistor and said reactance element is connected to the non-inverting input terminal of said differential amplifier.

Each of said two phase shifting circuits are connected in cascade. The added signal from said adding circuit is applied to the front stage phase shifting circuit of said two phase shifting circuits connected in cascade and the output signal from the subsequent stage phase shifting circuit is applied to one end of said feedback impedance element. The output of either one of the two phase shifting circuits is output as the tuned signal.

The tuning amplifier according to the present invention comprises an adding circuit for adding an input signal applied to one end of an input impedance element and a feedback signal applied to one end of a feedback impedance element, two phase shifting circuits including a differential amplifier wherein one end of a first resistor is connected to the inverting input terminal and an AC signal is applied by way of said first resistor, a second resistor interposed between the inverting input terminal and the output terminal of said differential amplifier, a third resistor wherein one end is connected to the inverting input terminal of said differential amplifier and the other end is connected ground, and a series circuit constituted by a reactance element using a capacitor or an inductor and a fourth resistor and connected to the other end of said first resistor. The junction point of said fourth resistor and said reactance element is connected to the non-inverting input terminal of said differential amplifier. Each of said two phase shifting circuits are connected in cascade. The added signal from said adding circuit is applied to the front stage phase shifting circuit of said two cascade connected phase shifting circuits, and the output signal from the subsequent stage phase shifting circuit is applied to one end of said feedback impedance element as said feedback signal. The output of either one of the two phase shifting circuits is output as the tuned signal.

The tuning amplifier according to the present invention comprises an adding circuit for adding an input signal applied to one end of an input impedance element and a feedback signal applied to one end of a feedback impedance element, a first phase shifting circuit including a differential amplifier wherein one end of a first resistor is connected to the inverting input terminal and an AC signal is applied by way of said first resistor, a first voltage dividing circuit connected to the output terminal of said differential amplifier, a second resistor interposed between the output terminal of said first voltage dividing circuit and the inverting input terminal of said differential amplifier, and a series circuit constituted by a reactance element using a capacitor or an inductor and a third resistor and connected to the other end of said first resistor, and wherein the junction point of said third resistor and said reactance element is connected to the non-inverting input terminal of said differential amplifier, and a second phase shifting circuit including a differential amplifier wherein one end of a fourth resistor is connected to the inverting input terminal and an AC signal is applied by way of said fourth resistor, a fifth resistor interposed between the inverting input terminal and the output terminal of said differential amplifier, a sixth resistor wherein one end is connected to the inverting input terminal of said differential amplifier and the other end is connected ground, and a series circuit constituted by a reactance element using a capacitor or an inductor and a seventh resistor and connected to the other end of said fourth resistor. The junction point of said seventh resistor and said reactance element is connected to the non-inverting input terminal of said differential amplifier. Said first and second phase shifting circuits are connected in cascade. The added signal from said adding circuit is applied to the front stage phase shifting circuit of said two cascade connected phase shifting circuits, and the output signal from the subsequent stage phase shifting circuit is applied to one end of said feedback impedance element as said feedback signal. The output of either one of said first and second phase shifting circuits is output as the tuned signal.

BEST MODE FOR CARRYING OUT THE INVENTION (First Embodiment)

Figure 1:
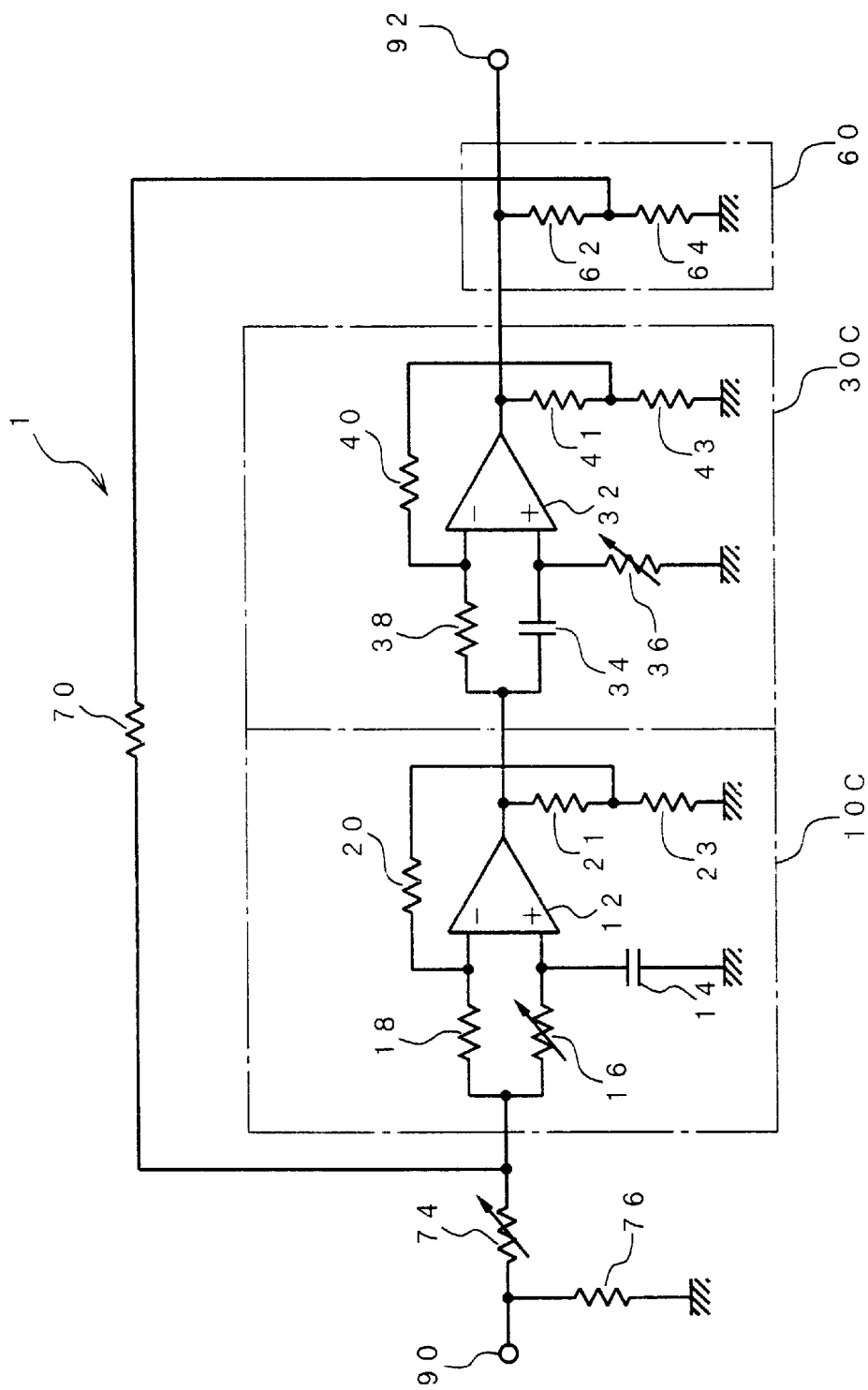
FIG. 1 is a circuit schematic of the tuning amplifier according to the first embodiment of the present invention.

Illustrated in FIG. 1 is a circuit schematic to show the principle of the first embodiment of the tuning amplifier to which the present invention is applied.

The tuning amplifier 1 in FIG. 1 includes two phase shifting circuits 10C, 30C for shifting the phase of the AC signal applied thereto by a certain phase angle to provide 360° overall phase shift at a certain frequency, a voltage dividing circuit 60 comprising resistors 62, 64 connected to the output of the subsequent stage phase shifting circuit 30C, and an adding circuit to add with a predetermined ratio the divided output (feedback signal) from the voltage dividing circuit 60 and the signal (input signal) applied to the input terminal 90 by way of a feedback resistor 70 and an input resistor 74, respectively. (Note that the input resistor 74 has n-times of resistance of the feedback resistor 70.)

Figure 2:
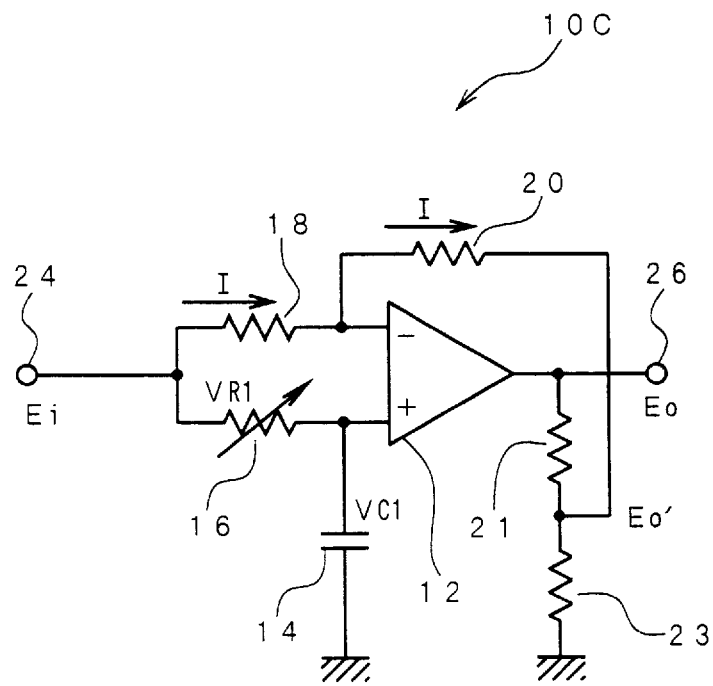
FIG. 2 is a circuit schematic of the phase shifting circuit at the first stage in FIG. 1.

FIG. 2 shows only the front or preceding stage of the phase shifting circuit 10C in FIG. 1, which comprises a variable resistor 16 and a capacitor 14 for shifting the phase of an input AC signal applied to an input terminal 24 before being applied to the non-inverting input terminal of the operational amplifier 12, a resistor 18 interposed between the input terminal 24 and an inverting input terminal of the operational amplifier 12, resistors 21, 23 defining a voltage dividing circuit connected to the output terminal of the operational amplifier 12, and a resistor 20 interposed between the voltage dividing circuit and the inverting input terminal of the operational amplifier 12.

In the phase shifting circuit 10C as configured above, the resistors 18, 20 are chosen to have equal resistance to each other.

When an AC signal is applied to the input terminal 24 in FIG. 2, applied to the non-inverting input terminal of the operational amplifier 12 is the voltage VC1 appearing across the capacitor 14. The voltage across the resistor 18 is equal to the voltage VR1 across the variable resistor 16. It is to be noted that the same current I flows through both resistors 18, 20 which have equal resistance as described above. This means that the same voltage VR1 develops across the resistor 20. With reference to the voltage VC1 on the non-inverting input terminal of the operational amplifier 12, vector summation of the voltage VR1 across the resistor 18 defines the input voltage Ei while vector subtraction of the voltage VR1 across the resistor 20 defines the voltage Eo' (output from the voltage dividing circuit) on the junction of the resistors 21, 23.

Figure 3:
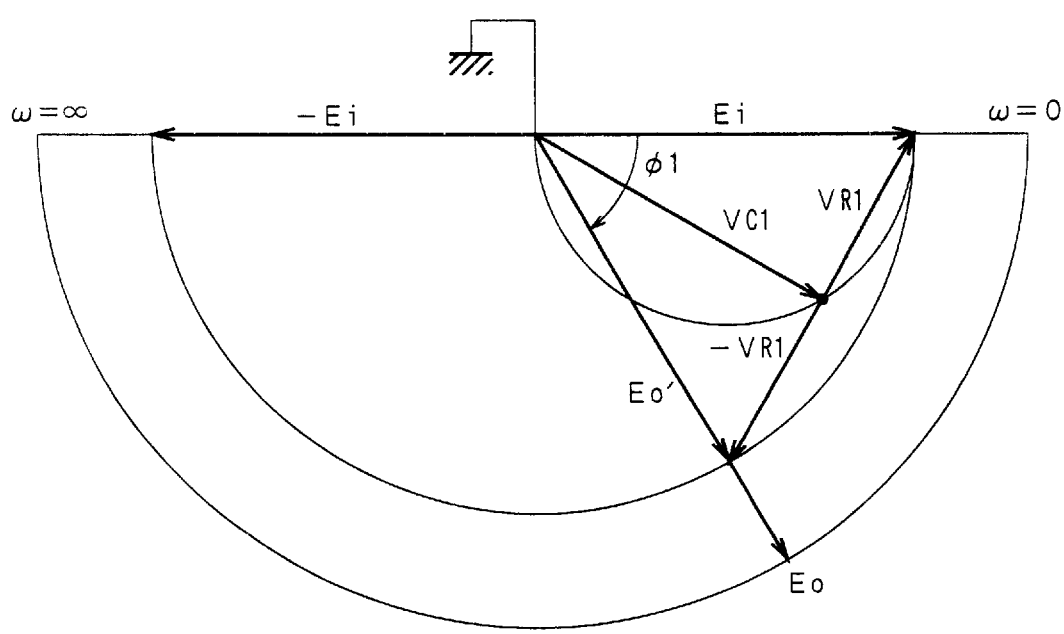
FIG. 3 is a vector diagram showing the relationship between the input and output voltages and the voltage across a capacitor and like in the phase shifting circuit at the first stage.

Illustrated in FIG. 3 is a vector diagram showing the relationship between the input and output voltages of the front stage phase shifting circuit 10C and the voltage across the capacitor.

With reference to the voltage VC1 on the non-inverting input terminal of the operational amplifier 12, both input voltage Ei and divided output Eo' are obtained by vector summation of the same voltage VR1 in opposite directions to each other and have equal absolute value to each other. As a result, magnitude and phase relationship between the input voltage Ei and the divided output Eo' can be represented by an isosceles triangle with the input voltage Ei and the divided output Eo' as two equal sides and twice of the voltage VR1 as the base. The amplitude of the divided output Eo' is equal to that of the input signal regardless of the frequency. The amount of phase shift is represented by $\phi 1$ in FIG. 3. The phase shift $\phi 1$ is varies from 0° to 180° in response to the frequency. Moreover, the phase shift $\phi 1$ can be varied by varying the resistance R of the variable resistor 16.

Also, since the output terminal 26 of the phase shifting circuit 10C is connected to the output terminal of the operational amplifier 12, there is the following relationship between the output voltage Eo and the above mentioned divided output Eo' if the resistance R21 of the resistor 21 and the resistance R23 of the resistor 23 are sufficiently small as compared with the resistance of the resistor 20:

$$Eo = (1 + R21/R23)Eo'$$

This suggests that the gain can be set larger than 1 by adjusting R21 and R23. Additionally, the amplitude of the output voltage Eo remains constant as the frequency varies and the phase angle can be shifted as shown in FIG. 3.

Figure 4:
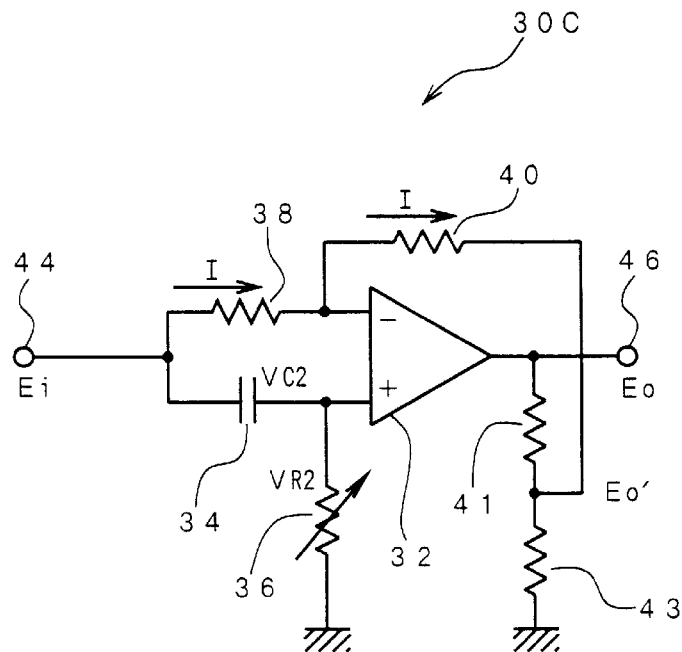
FIG. 4 is a circuit schematic of the subsequent stage phase shifting circuit in FIG. 1.

Now, illustrated in FIG. 4 is an extraction of the subsequent stage phase shifting circuit 30C in FIG. 1. The subsequent stage phase shifting circuit 30C in FIG. 4 comprises an operational amplifier 32 as a differential amplifier, a capacitor 34 and a variable resistor 36 for shifting the phase of the input signal applied to an input terminal 44 before being applied to the non-inverting input terminal of the operational amplifier 32, a resistor 38 interposed between the input terminal 44 and the inverting input terminal of the operational amplifier 32, resistors 41, 43 defining a voltage dividing circuit to be connected to the output terminal of the operational amplifier 32 and a resistor 40 interposed between the voltage dividing circuit and the inverting input of the operational amplifier 32.

The resistors 38 and 40 in the above phase shifting circuit 30C are chosen to be equal to each other.

When an input AC signal is applied to the input terminal 44 in FIG. 4, applied to the non-inverting input terminal of the operational amplifier 32 is the voltage VR2 across the variable resistor 36. Note that the voltage across the resistor 38 is equal to the voltage VC2 across the capacitor 34. The same current I flows through the two resistors 38, 40 which have equal resistance to each other as mentioned above, thereby developing the voltage VC2 across the resistor 40. With reference to the non-inverting input terminal (voltage VR2) of the operational amplifier 32, vector summation of the voltage VC2 across the resistor 38 provides the input voltage Ei while vector subtraction of the voltage VC2 across the resistor 40 provides the voltage (divided output) Eo' on the junction of the resistors 41, 43.

Figure 5:
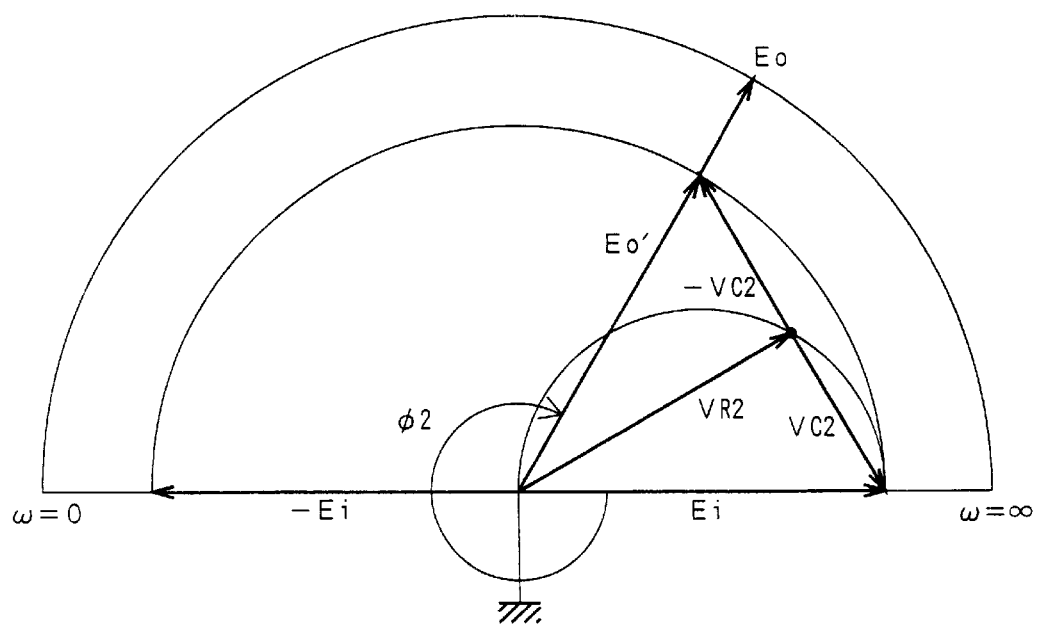
FIG. 5 is a vector diagram showing the relationship between the input and output voltages and the voltage across the capacitor and the like in the phase shifting circuit at the subsequent stage.

FIG. 5 is a vector diagram showing the relationship between the input and output voltages and the voltage across the capacitor in the subsequent stage phase shifting circuit 30C. As mentioned above, with reference to the voltage VR2 to be applied to the non-inverting input terminal of the operation amplifier 32, the input voltage Ei and the divided output voltage Eo' are different from each other only in the polarity of vector combination of the voltage VC2 and thus are equal in absolute value. As a result, the relationship in magnitude and phase relationship of the input voltage Ei and the divided output Eo' can be represented by an isosceles triangle with the input voltage Ei and the divided output Eo' as two equal sides and with twice of the voltage VC2 as the base. The amplitude of the divided output Eo' is equal to that of the input signal regardless of the frequency. The phase shift is represented by φ2 as shown in FIG. 5. The phase shift φ2 is varies from 180° to 360°, with reference to the input voltage Ei, to a clock wise direction in response to the frequency. Moreover, the phase shift φ2 can be varied by varying the resistance R of the variable resistor 36.

Also, since the output terminal 46 of the phase shifting circuit 30C is connected to the output terminal of the operational amplifier 32, there is the following relationship between the output voltage Eo and the above mentioned divided output Eo' if the resistance R41 of the resistor 41 and the resistance R43 of the resistor 43 are sufficiently small as compared with the resistance of the resistor 40:

$$Eo=(1+R41/R43)Eo'$$

This suggests that the gain can be set larger than 1 by adjusting R41 and R43. Additionally, the amplitude of the output voltage Eo remains constant as the frequency varies and the phase angle can be shifted as shown in FIG. 5.

In this manner, the phase shift takes place in each of the two phase shifting circuits 10C, 30C. As shown in FIGS. 3 and 5, the total phase shift of the two phase shifting circuits 10C, 30C is 360° at a certain frequency.

The output from the subsequent stage phase shifting circuit 30C is derived from the tuning amplifier 1 at the output terminal 92. The output from the phase shifting circuit 30C is divided by the voltage dividing circuit 60 before being fed back to the input side of the front stage phase shifting circuit 10C by way of the feedback resistor 70. The feedback signal and the input signal applied by way of the input resistor 74 are added together before being applied to the front stage phase shifting circuit 10C.

As described hereinbefore, the total phase shift of the two phase shifting circuits 10C, 30C is equal to 360° at a certain frequency. If the feedback loop gain of the two phase shifting circuits 10C, 30C, the voltage dividing circuit 60 and the feedback resistor 70 to 1 or lower, only the aforementioned frequency component is permitted to pass, thereby achieving the intended tuning operation.

Note that derived from the output terminal 92 of the tuning amplifier 1 is the output from the phase shifting circuit 30C before being divided by the voltage dividing circuit 60. This means that the tuning amplifier 1 provides a gain to amplify the signal simultaneously with tuning operation.

Figure 6:
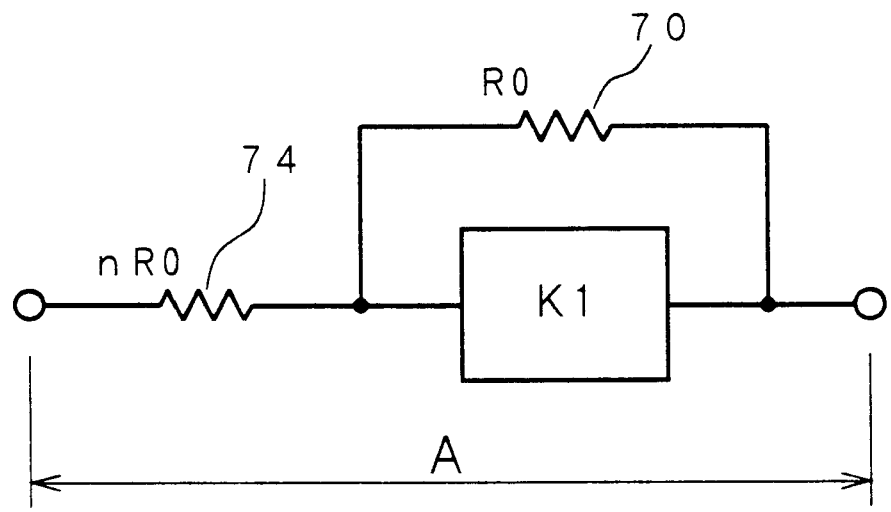
FIG. 6 is a system diagram of the entire circuit including the two phase shifting circuits and the voltage dividing circuit replaced by a circuit having a transfer function K1.

Illustrated in FIG. 6 is a system diagram of the above mentioned two phase shifting circuits 10C, 30C and the voltage dividing circuit 60 replaced by the transfer function K1. A circuit having the transfer function K1 is paralleled with the feedback resistor 70 having a resistance R0 and connected to the input resistor 74 having a resistance equal to n times of R0 (=nR0).

Figure 7:
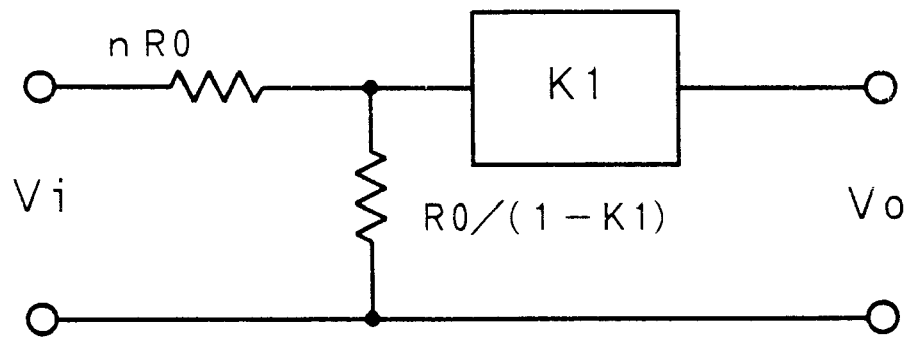
FIG. 7 is a system diagram in FIG. 6 converted by the Miller's principle.

Also illustrated in FIG. 7 is a system diagram of the system in FIG. 6 converted by using the Miller's principle. The overall transfer function A of the converted system is given by the following expression (1):

$$A=Vo/Vi=K1/\{n(1-K1)+1\} \quad (1)$$

The transfer function K2 of the front stage phase shifting circuit 10C is given by the following expression (2):

$$K2=a_1(1-T_1s)/(1+T_1s) \quad (2)$$

Where, $T_1$ is the time constant of the CR circuit defined by the variable resistor 16 and the capacitor 14 (let the resistance of the variable resistor 16 be R and the capacitance of the capacitor 14 be C, $T_1$=CR), s=jω and $a_1$ is the gain of the phase shifting circuit 10C, thereby $a_1$=(1+R21/R23)>1.

Also, the transfer function K3 of the subsequent stage phase shifting circuit 30C is given by the following expression (3):

$$K3=-a_2(1-T_2s)/(1+T_2s) \quad (3)$$

Where, $T_2$ is the time constant of the CR circuit comprising the capacitor 34 and the variable resistor 36 (let the capacitance of the capacitor 34 be C and the resistance of the variable resistor 36 be R, $T_2$=CR), and $a_2$ is the gain of the phase shifting circuit 30C, thereby $a_2$=(1+R41/R43)>1.

Assuming that the signal amplitude is attenuated by $1/a_1 a_2$ by way of the voltage dividing circuit 60, the overall transfer function K1 of the cascade connected circuit of the two phase shifting circuits 10C, 30C and the voltage dividing circuit 60 is given by the following expression (4):

$$K1=-\{1+(Ts)^2-2Ts\}/\{1+(Ts)^2+2Ts\} \quad (4)$$

Note that both time constants $T_1$ and $T_2$ of the phase shifting circuits are considered to be equal to T in the above expression (4) for simplicity. A combination of the above expressions (4) and (1) leads to the following expression (5):

$$A = -\{1 + (Ts)^2 - 2Ts\} / [(2n+1)\{1 + (Ts)^2\} + 2Ts] \quad (5)$$
$$= -\{1/(2n+1)\}[\{1 + (Ts)^2 - 2Ts\} /$$
$$\{1 + (Ts)^2 + 2Ts/(2n+1)\}]$$

Figure 8:
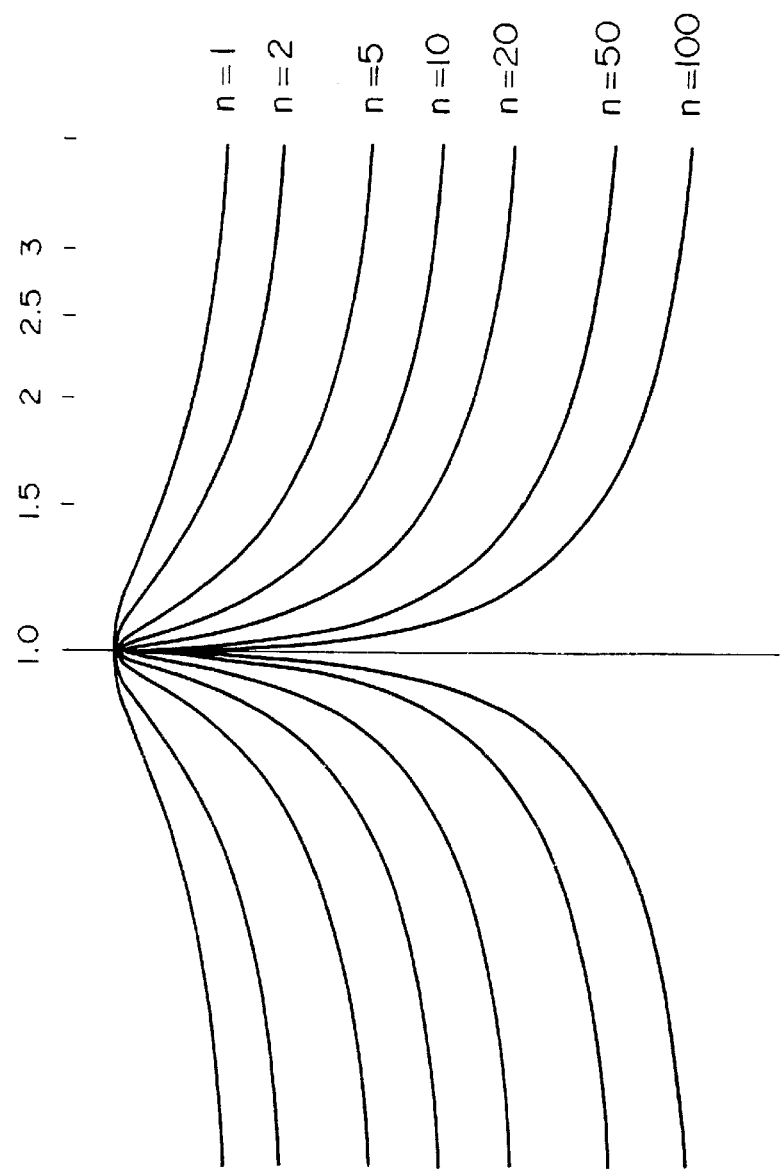
FIG. 8 is a characteristic chart of the tuning amplifier as shown in FIG. 1.

According to the expression (5), the maximum attenuation $A=-1/(2n+1)$ is achieved at $\omega=0$ (DC domain). Also, $A=-1/(2n+1)$ at $\omega=\infty$. At the tuning point of $\omega=1/T$ (if the time constants of the phase shifting circuits differ, the tuning point $\omega=1/\sqrt{(T_1 \cdot T_2)}$), $A=1$ independent of the resistance ration of the feedback resistor 70 and the input resistor 74. In other words, the tuning point and the attenuation at the tuning point remain unchanged as the resistance ratio n is varied as shown in FIG. 8.

Now, in the above FIG. 6, since the voltage dividing circuit by the feedback resistor 70 and the input impedance of the full band pass circuit is formed in case of the full band pass circuit given by the transfer function K1 has the input impedance, the open loop gain of the feedback loop including the full band pass circuit is smaller than absolute value of the transfer function K1. The input impedance of the full band pass circuit means the input impedance of the front stage phase shifting circuit 10C and is nothing but the input impedance formed by a series impedance of the CR circuit comprising the variable resistor 16 and the capacitor 14 connected in parallel to the input resistor 18 of the operational amplifier 12. Consequently, in order to compensate for the loss of the open loop gain of the feedback loop by the input impedance of the full band pass circuit, it is necessary that the gain of the full band pass circuit itself is set to more than 1.

For example, in case of the voltage dividing circuit by the resistor 21, 23 included in the phase shifting circuit 10C is disregarded (the case of the voltage dividing ratio as 1 and a1 in the above expression (2) as 1), according to the above expression (2) the phase shifting circuit 10C is required to operate within the range of the gain from 1 time of the follower circuit to −1 time of the inverter amplifier in response to the input frequency and therefore, the resistance ratio of the resister 18 and 20 is preferably not made as other than 1. This is because, providing that each resistance of the resistor 18 and 20 is represented by R18 and R20, since the gain at the time when the phase shifting circuit 10C operates as the inverter amplifier is −R20/R18, while the gain at the time when the phase shifting circuit 10C operates as the follower circuit is always 1 regardless of the resistance ratio of the resistor 18 and the resistor 20, only the phase shift between the input and the output is varied in the full band where the phase shifting circuit 10C operates in the case that the resistance ratio of the resistor 18 and the resistor 20 is not 1 and the ideal condition that the output amplitude does not change is not satisfied.

By adding the voltage dividing circuit comprising the resistor 21 and the resistor 23 to the output side of the phase shifting circuit 10C and feeding back the signal to the inverting input terminal of the operational amplifier 12 by way of the voltage dividing circuit, the gain of the phase shifting circuit 10C can be set to more than 1 while the resistance ratio of the resistor 18 and 20 can be kept at 1. Similarly, by adding the voltage dividing circuit comprising the resistor 41 and the resistor 43 to the output side of the phase shifting circuit 30C and feeding back the signal to the inverting input terminal of the operational amplifier 32 by way of the voltage dividing circuit, the gain of the phase shifting circuit 30C can be set to more than 1 while the resistance ratio of the resistor 38 and 40 can be held at 1.

As described above, since the time constant T1 of the CR circuit comprising the capacitor 14 and the variable resistor 16 and the time constant T2 of the CR circuit comprising the capacitor 34 and the resistor 36 can be varied by changing the resistance of the variable resistor 16 of the phase shifting circuit 10C and the variable resistor 36 of the phase shifting circuit 30C, the tuning frequency $\omega$ given by $1/\sqrt{(T1\,T2)}$ can be varied in a certain range.

Now, from the above expressions (2) or (3) as follows the phase angles $\phi 1$ and $\phi 2$ as shown in FIGS. 3 and 5 are given by the following expressions (6) and (7):

$$\phi 1 = \tan\{2\omega T_1/(1-\omega^2 T_1^2)\} \quad (6)$$
$$\phi 2 = -\tan\{2\omega T_2/(1-\omega^2 T_2^2)\} \quad (7)$$

Note that, for $\phi 1$ and $\phi 2$ of the expressions (6), (7), a clockwise direction (a phase lag direction) is represented by a forward direction on the basis of the input voltage E1 as shown in FIGS. 3 and 5.

In case of, for example, $T_1=T_2(=T)$, the total phase shift of the two phase shifting circuits 10C, 30C is equal to 360° to achieve the aforementioned tuning operation when $\omega=1/T$. At this point, $\phi 1=90°$ and $\phi 2=270°$.

As described above, the tuning amplifier according to the first embodiment has a constant tuning frequency and gain at the time of tuning even when the resistance ratio of the feedback resistor 70 and the input resistor 74 is varied and yet performs the tuning operation by using the tuning amplifier 1 which can change the maximum attenuation and the tuning frequency band width. For this reason, when a radio interference arises, the radio interference can be prevented by making said resistance ratio larger and the frequency band width narrower, while when the radio interference is little, the received signal can be reproduced faithfully. Further, according to the first embodiment as described above, though the resistance ratio of the feedback resistor 70 and the input resistor 74 is fixed, at least either one of the resistors is made variable, thereby the resistance ratio n may be made optionally variable.

Also, in the tuning amplifier 1 of the first embodiment, since the resistors 18, 20 in the phase shifting circuit 10C are set to equal to each other and similarly the resistors 38, 40 in the phase shifting circuit 30C equal to each other, it is possible to obtain the tuned output of substantially constant amplitude by preventing the amplitude from fluctuating when the tuning frequency in each tuning amplifier is varied.

Particularly important is the fact that the resistance ratio n can be increased to increase the quality factor Q of the tuning amplifier 1 while suppressing amplitude fluctuation in the tuned output. In other words, if there is frequency dependency in the open loop gain, even choosing a large resistance ratio n does not help to increase Q in lower gain frequencies and there is a possibility of increasing the open loop gain greater than 1 to cause oscillation in higher gain frequencies. As a result, the resistance ratio n cannot be set too high to prevent such oscillation in high amplitude fluctuation, thereby requiring to set the Q in the tuning amplifier 1 to relatively low. Alternatively, in the above mentioned first embodiment, the amplitude fluctuation in the tuned output from the tuning amplifier 1 can be suppressed by connecting the voltage dividing circuits in the phase shifting circuits 10C, 30C, and the resistors 18, 20, and similarly the resistors 38, 40 are chosen to have equal resistance to each other, thereby making it possible to set the resistance ratio n high and the quality factor Q of the tuning amplifier 1 high.

Also, by using the attenuated signal through the voltage dividing circuit 60 as a feedback signal and taking out the signal before being input to the voltage dividing circuit 60 as an output of the tuning amplifier 1, both a tuning operation in which only a given frequency component is extracted and a given amplifying operation for the extracted signal can be performed. Moreover, the gain at this time can be optionally set by changing the voltage dividing ratio of the voltage dividing circuit 60.

Since the maximum attenuation depends on the resistance ratio n of the feedback resistor 70 and the input resistor 74, and the tuning frequency depends on the resistance of the variable resister 16 or 36, thereby enabling to adjust the tuning frequency and the maximum attenuation without interference therebetween. It is to be noted here that the one of the variable resistors 16, 36 can be replaced to the fixed resistance.

It is also noted that the tuning amplifier 1 is constructed by a combination of operational amplifiers, capacitors and resistors and they all can be fabricated on a semiconductor substrate.

Also, by continuously changing the resistance of at least either one of resistors 16, 36, the tuning frequency can be continuously varied and the variable condenser necessary and indispensable in the past for the change of the tuning frequency can be removed, thereby the manufacturing process is sharply simplified and the cost-down thereof is realized.

Note that when the phase shifting circuit 10C as described in FIG. 2 and the phase shifting circuit 30C as described in FIG. 4 are connected in cascade, either one of the voltage dividing circuits from the voltage dividing circuits connected to the output side of the operational amplifier 12 or 13 in each of the phase shifting circuits may be omitted or the voltage dividing ratio may be set to 1. For example, the output terminal of the operational amplifier 12 is directly connected to one end of the resistor 20 by omitting the voltage dividing circuit in the phase shifting circuit 10C. This is identical to the case where the resistance of the resistor 62 comprising the voltage dividing circuit is made extremely small and the voltage dividing ratio is set to 1.

Thus, when the gain is set to 1 by omitting the voltage dividing circuit of either one of the two phase shifting circuits, the same tuning operation as with the tuning amplifier 1 as shown in FIG. 1 is made by making the gain of the other phase shifting circuit larger than 1.

Also, when the tuning operation is not necessary, the subsequent stage voltage dividing circuit 60 of the phase shifting circuit 30C may be omitted with the output of the phase shifting circuit 30C returned directly to the front stage or the resistance of the resistor 62 in the voltage dividing circuit 60 may be made small with the voltage dividing ratio set to 1.

(Second Embodiment)

Above mentioned the tuning amplifier 1 includes CR circuits in the phase shifting circuits 10C, 30C, such CR circuits may be replaced by LR circuits.

Figure 9:
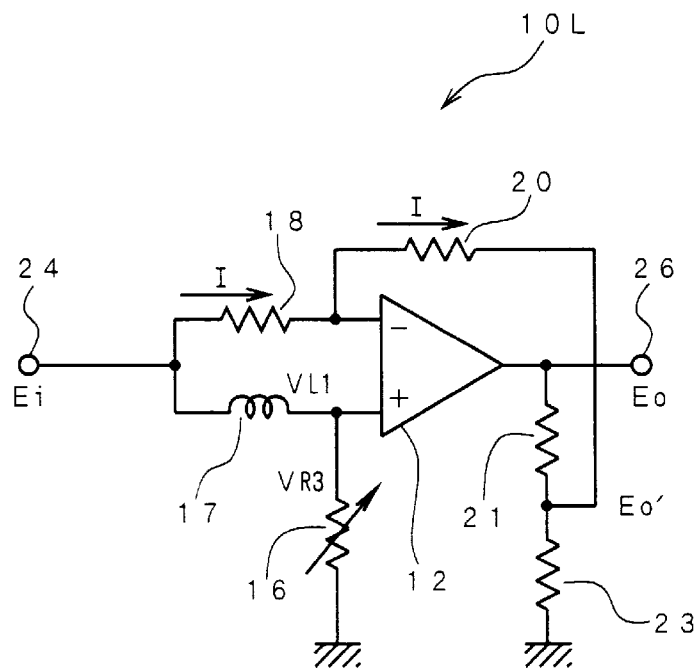
FIG. 9 is a circuit schematic of a phase shifting circuit including an LR circuit.

Illustrated in FIG. 9 is a circuit schematic of a phase shifting circuit including an LR circuit, which can be replaced for the front stage phase shifting circuit 10C in the tuning amplifier 1 as shown in FIG. 1. The phase shifting circuit 10L is derived from the phase shifting circuit 10C in FIG. 1 by replacing the CR circuit of the capacitor 14 and the variable resistor 16 by the LR circuit of a variable resistor 16 and an inductor 17. The resistors 18, 20 are chosen to be equal to each other.

Figure 10:
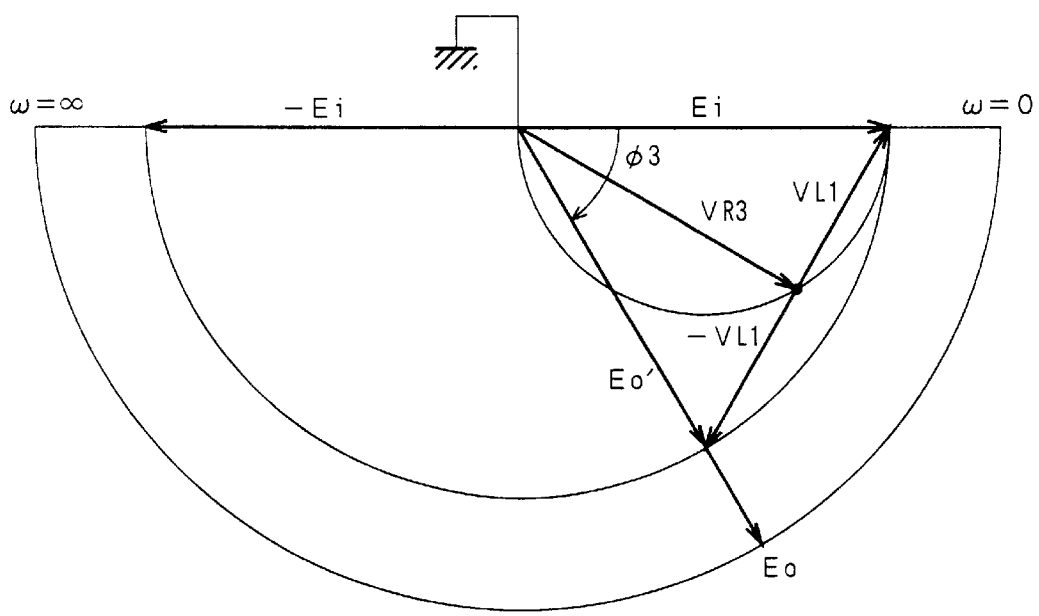
FIG. 10 is a vector diagram showing the relationship between the input and output voltages and the voltage across the inductor and the like in the phase shifting circuit in FIG. 9.

Consequently, as shown in FIG. 10, the relationship between the input and the output voltage or the like of the above described phase shifting circuit 10L can be studied by replacing the voltage VC1 as shown in FIG. 3 by the voltage VR3 across the variable resistor 16 and the voltage VR1 as shown in FIG. 3 by the voltage VL1 across the inductor 17.

The transfer function of the phase shifting circuit 10L as shown in FIG. 9 is the same as K2 in the above expression (2), wherein the time constant $T_1$ of the LR circuit comprising the inductor 17 and the variable resistor 16 is equal to L/R (i.e., $T_1$=L/R). L and R represent the inductance of the inductor 17, and the resistance of the variable resistor 16, respectively. Also, the phase shift φ3 is the same as φ1 given by the above expression (6) if the above time constant $T_1$ is used.

As understood from the foregoing description, the phase shifting circuits 10L as shown in FIG. 9 is equivalent to the phase shifting circuits 10C as shown in FIG. 2, respectively. It is therefore possible to replace the phase shifting circuit 10C of the tuning amplifier 1 can be replaced by the phase shifting circuit 10L as shown in FIG. 9, respectively. Also, since the resistors 18, 20 shown in the FIG. 9 are set to equal to each other, it is possible to obtain the tuned output of substantially constant amplitude by preventing the amplitude from fluctuating when the tuning frequency in each tuning amplifier is varied. The resistors 38, 40 are chosen to be equal to each other.

Figure 12:
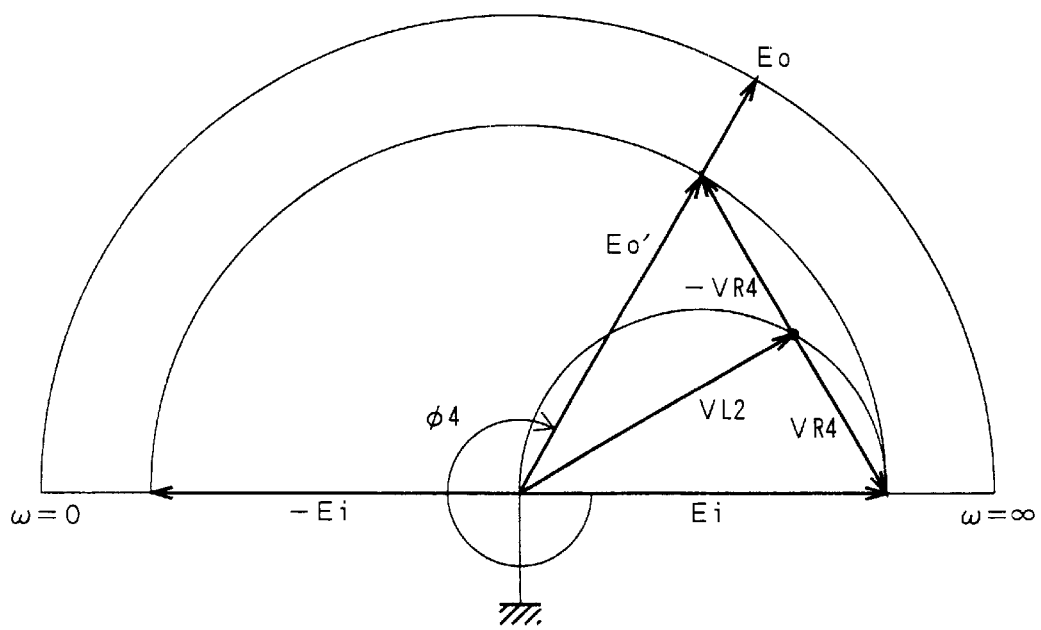
FIG. 12 is a vector diagram showing the relationship between the input and output voltages and the voltage across the inductor and the like in the phase shifting circuit as shown in FIG. 11.

Consequently, as shown in FIG. 12, the relationship between the input and the output voltage or the like of the above described phase shifting circuit 30L can be studied by replacing the voltage VR2 as shown in FIG. 5 by the voltage VL2 across the inductor 37 and the voltage VC2 as shown in FIG. 5 by the voltage VR4 across the variable resistor 36.

Figure 11:
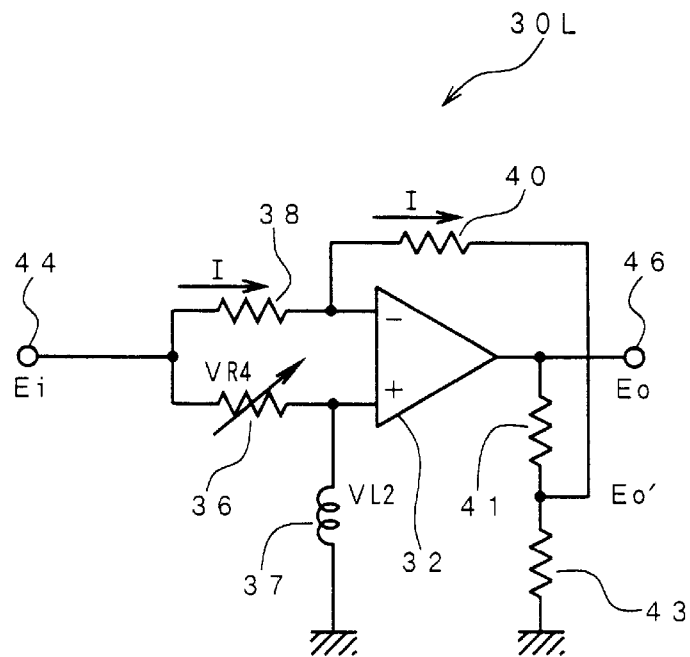
FIG. 11 is a circuit schematic of another phase shifting circuit including an LR circuit.

Incidentally, the transfer function of the phase shifting circuit 30L in FIG. 11 is given by the K3 in the expression (3) and the phase shift φ4 shown in FIG. 12 is the same as φ2 given by the above expression (7) if the time constant $T_2$ of the LR circuit comprising the variable resistor 36 and the inductor 37 is L/R (i.e., $T_2$=L/R, where R and L represent the resistance of the variable resistor 36 and the inductance of the inductor 37, respectively).

In this way, either one of the two phase shifting circuits 10C and 30C or both of the circuits can be replaced by the phase shifting circuits 10L, 30L as shown in FIG. 9, FIG. 11. If both of the phase shifting circuits 10C, 30C are replaced by the phase shifting circuits 10L, 30L, it is easy for the tuning frequency to provide higher frequency by configuring the entire tuning circuit as an integrated circuit.

Further, in the case that both of or either one of the two phase shifting circuits 10C, 30C are replaced by the phase shifting circuit 10L or 30L and when the entire tuning circuit including the inductance comprising the LR circuit or excluding the inductance is configured as an integrated circuit, the so-called temperature compensation can be made for preventing fluctuation of the tuning frequency due to variation in temperature.

Also, when at least either one of the phase shifting circuits 10C, 30C as shown in FIG. 1 is replaced by the phase shifting circuits 10L, 30L as shown in FIG. 9 or FIG. 11, either one of the voltage dividing circuit from the voltage dividing circuits connected to the output side of the operational amplifier 12 or 32 may be omitted with the voltage dividing ratio set to 1. Also, the resistance of the resistor 62 comprising the voltage dividing circuit 60 may be made small with the voltage diving ratio set to 1.

(Third Embodiment)

Figure 13:
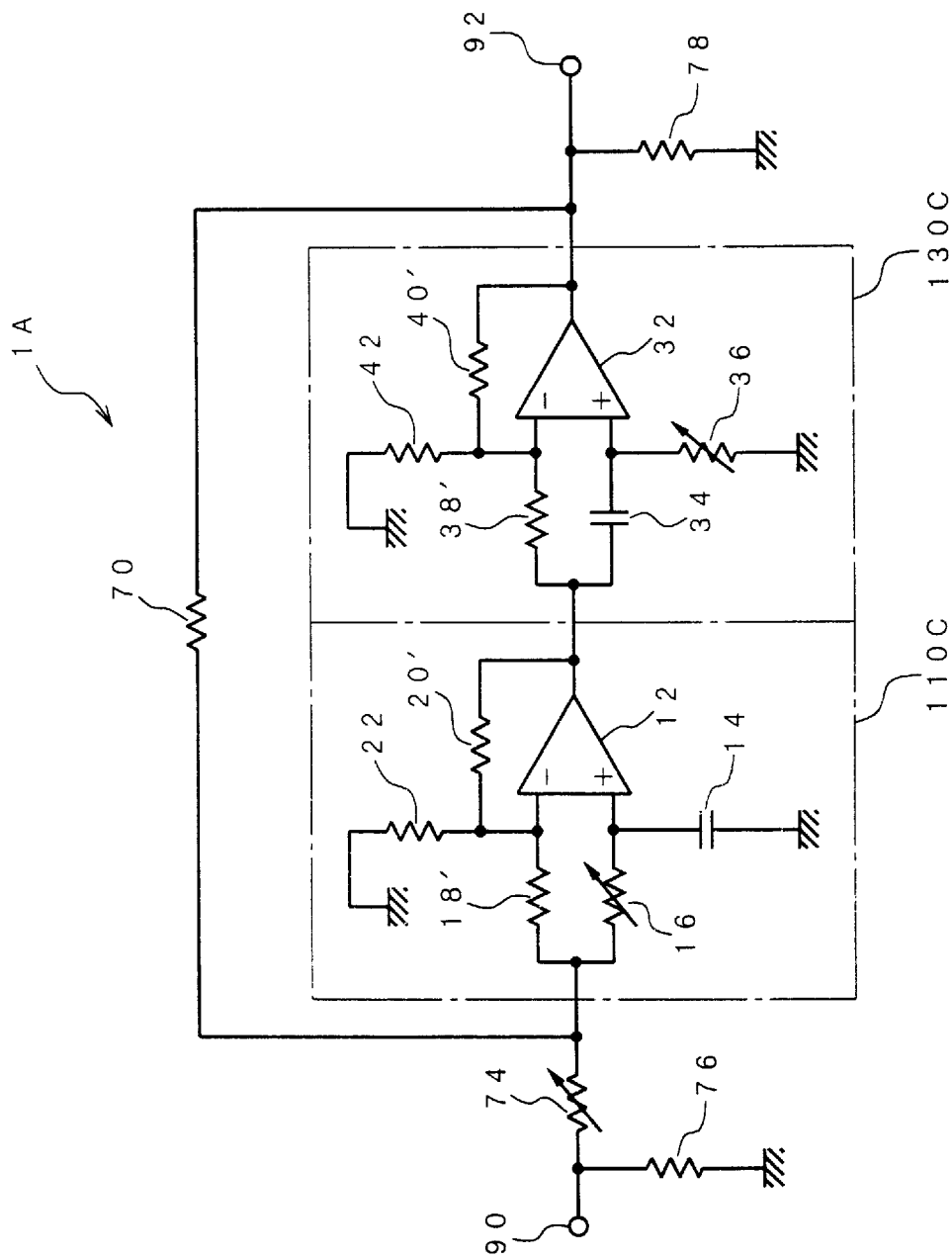
FIG. 13 is a circuit schematic of the tuning amplifier according to the third embodiment of the present invention.

Illustrated in FIG. 13 is a circuit schematic to show the principle of the third embodiment of the tuning amplifier to which the present invention is applied.

The tuning amplifier 1A in FIG. 13 includes two phase shifting circuits 110C, 130C for shifting the phase of the AC signal applied thereto by a certain phase angle to provide 360° overall phase shift at a certain frequency, and an adding circuit to add with a predetermined ratio the divided output (feedback signal) and the signal (input signal) applied to the input terminal 90 by way of a feedback resistor 70 and an input resistor 74, respectively. (Note that the input resistor 74 has n-times of resistance of the feedback resistor 70.

In the tuning amplifier 1 as shown in FIG. 1, the resistance of the resistors 18, 20 in the front stage phase shifting circuit 10C are set equal to each other, thereby maintaining the output amplitude unchanged when the frequency of the input AC signal varies. Also, the voltage dividing circuit comprising the resistors 21, 23 connected to the output of the operational amplifier 12 sets the gain greater than 1. On the contrary, the front stage phase shifting circuit 110C included in the tuning amplifier 1A in FIG. 13 does not employ the voltage dividing circuit comprising the resistors 21, 23 and the gain of the phase shifting circuit 110C is set greater than 1 by choosing the resistance of the resistor 20' larger than that of the resistor 18'.

The same is true about the subsequent stage phase shifting circuit 130C and the gain is set greater than 1 by choosing the resistance of the resistor 40' larger than that of the resistor 38'. Also, the output terminal of the phase shifting circuit 130C is connected to the feedback resistor 70, the output terminal 92, and the resistor 78.

Note that, in the tuning amplifier 1 as shown in FIG. 13, the voltage dividing circuit may be connected to the subsequent stage of the phase shifting circuit 130C with the voltage divided output returned by way of the feedback resistor 70. In case of setting the gain of each phase shifting circuit greater than 1, the gain tends to vary depending on the input signal frequency. Taking the front stage phase shifting circuit 110C as an example, the phase shifting circuit 110C acts as a voltage follower with a unity (1) gain in low input signal frequencies. In high frequencies, however, the phase shifting circuit 110C acts as an inverter amplifier with the gain of −m (m represents the resistance ratio between the resistors 20' and 18' ), the gain of the phase shifting circuit 110C and thus the output signal amplitude tend to vary depending on the input signal frequency.

Such amplitude variation may be suppressed by connecting a resistor 22 to the inverting input terminal of the operational amplifier 12 by equalizing the gains in low and high input signal frequencies. Similarly, in the phase shifting circuit 130C, a resistor 42 having a predetermined resistance is connected to the inverting input terminal of the operational amplifier 32, thereby suppressing the output signal amplitude variation.

Figure 14:
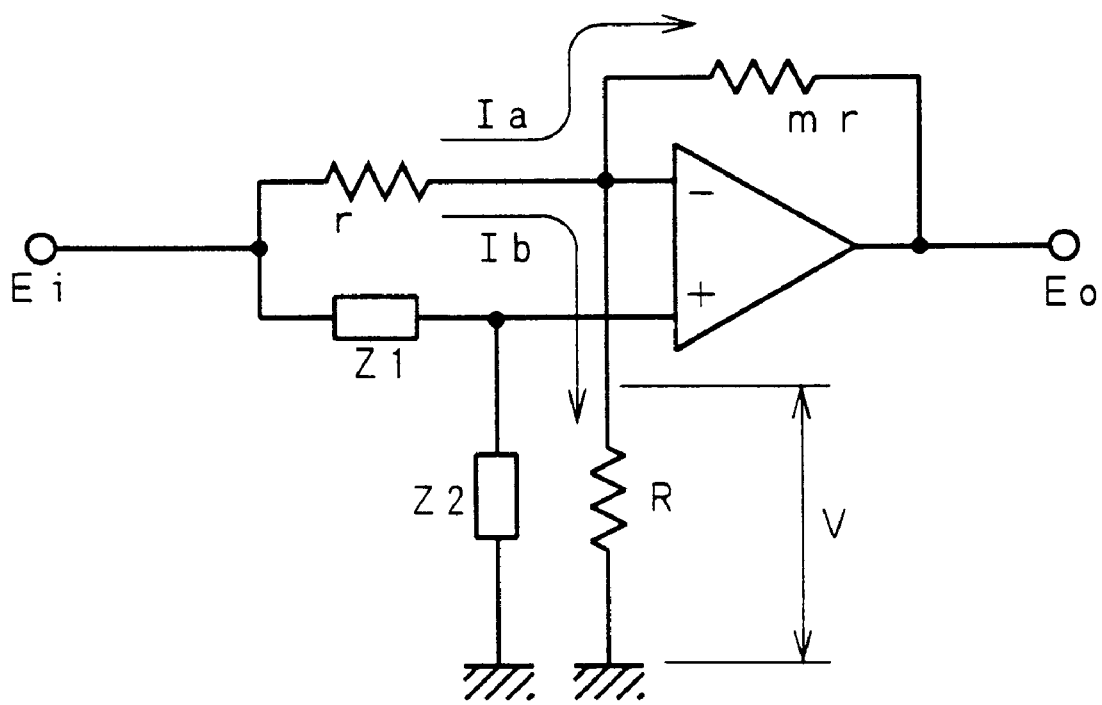
FIG. 14 is a generalized circuit schematic of the phase shifting circuits in the tuning amplifier as shown in FIG. 13.

Then, proper setting of the resistance of the resistor 22 (or resistor 42) will be studied. Illustrated in FIG. 14 is a generalized circuit schematic of the above mentioned phase shifting circuits 110C, 130C. The CR circuit included in each phase shifting circuit is represented by elements having impedance z1 and z2. As shown in FIG. 14, the resistance of the input resistor of the operational amplifier is represented by r, the resistance of the feedback resistor mr, the resistance of the resistor (22 or 42) connected to the inverting input terminal of the operational amplifier R, and the potential on the inverting input terminal of the operational amplifier V. Then, the following relationship holds true between the input voltage Ei and the potential V:

$$r(Ia+Ib)+V=Ei \quad (8)$$

Also, the potential V can be represented as follows by using varies constants shown in FIG. 14:

$$V=Ib\ R \quad (9)$$

$$V=Eo+mr\cdot Ia \quad (10)$$

$$V=\{z2/(z1+z2)\}Ei=kEi \quad (11)$$

In the expression (11), the dividing ratio of the two elements having impedance z1 and z2 is represented by k.

Ia and Ib are calculated from the above expressions (10) and (9) and substituted in the expression (8) and then the result in the expression (11) to eliminate V. Then, $$Ea=(Rk+Rmk+mrk-Rm)Ei/R \quad (12)$$

Incidentally, condition when the phase shifting circuit as shown in FIG. 14 operates as an inverter amplifier is that the impedance z2 is equal to 0Ω and k=0. Then, the expression (12) can be:

$$Eo=-mEi \quad (13)$$

Condition when the phase shifting circuit in FIG. 14 operates as a follower circuit is that the impedance z1 is equal to 0Ω and k=1. Then, the expression (12) can be:

$$Eo=(R+mr)Ei/R \quad (14)$$

IF there is no gain changes when the phase shifting circuit 110C or 130C operates as an inverting amplifier and a follower circuit, the absolute values of Eo given by the expressions (13) and (14) are equal to each other, thereby establishing the following expression (15):

$$m=(R+mr)/R \quad (15)$$

$$R=mr/(m-i) \quad (16)$$

As a result, setting the resistance R of the resistor 22 in the phase shifting circuit 110C or the resistance R of the resistor 42 in the phase shifting circuit 130C in accordance with the expression (16) helps to suppress the gain changes as the frequency is varied from low frequency to high frequency.

(Forth Embodiment)

The tuning amplifier 1 shown in FIG. 13 includes CR circuits in the phase shifting circuits 110C, 130C, such CR circuits may be replaced by LR circuits each comprising a resistor and an inductor.

Figure 15:
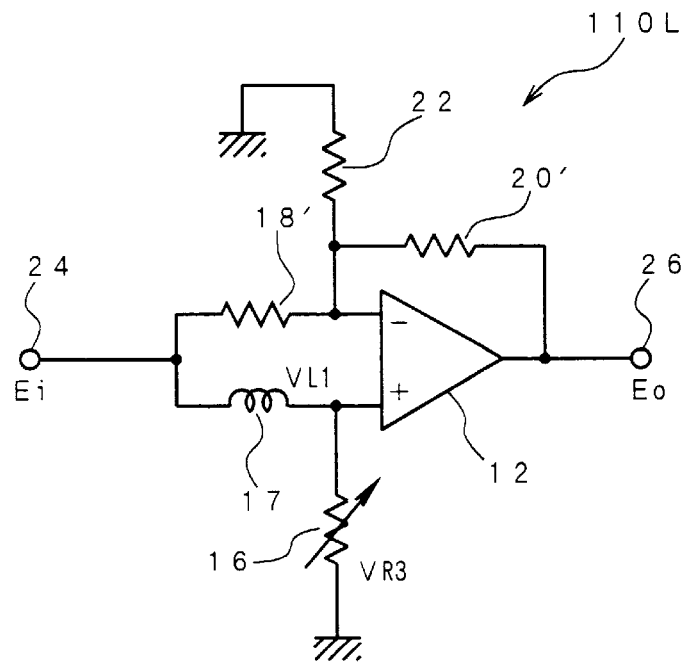
FIG. 15 is a circuit schematic of an alternative phase shifting circuit to the one in the front stage in FIG. 13.

Now, illustrated in FIG. 15 is a circuit schematic of a phase shifting circuit including such LR circuit, which can be replaced for the front stage phase shifting circuit 110C in the tuning amplifier 1A as shown in FIG. 13. The phase shifting circuit 110L as shown in FIG. 15 is equal to the front stage phase shifting circuit 110C in FIG. 13 with the CR circuit of the capacitor 14 and the variable resistor 16 replaced by the LR circuit of a variable resistor 16 and an inductor 17.

Figure 16:
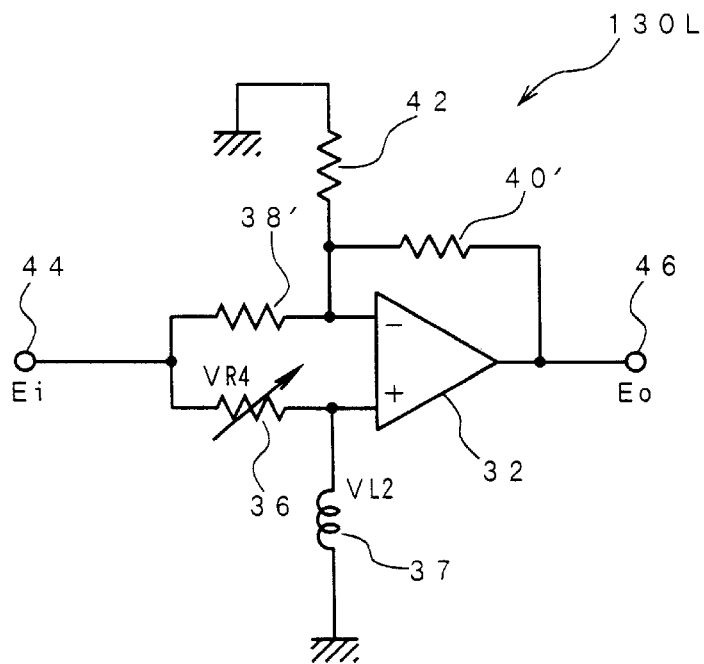
FIG. 16 is a circuit schematic of an alternative phase shifting circuit to the one in the subsequent stage in FIG. 13.

Illustrated in FIG. 16 is another circuit schematic of a phase shifting circuit including such LR circuit, which can be replaced for the front stage phase shifting circuit 130C in the tuning amplifier 1A as shown in FIG. 13. The phase shifting circuit 130L as shown in FIG. 16 is equal to the front stage phase shifting circuit 110C in FIG. 13 with the CR circuit of the variable resistor 36 and the capacitor 34 replaced by the LR circuit of an inductor 37 and a variable resistor 36.

Each of the phase shifting circuit 110L as shown in FIG. 15 and the phase shifting circuit 130L as shown in FIG. 16 has equal value to each of the phase shifting circuit 110C and 130C as shown in FIG. 13 and, in the tuning amplifier 1A as shown in FIG. 13, the front stage phase shifting circuit 110C can be replaced by the phase shifting circuit 110L as shown in FIG. 15 and the subsequent stage phase shifting circuit 130C by the phase shifting circuit 130L as shown in FIG. 16, respectively. When each of the two phase shifting circuits 110C and 130C as shown in FIG. 13 is replaced by the phase shifting circuits 110L and 130L, it is easy for the tuning frequency to provide higher frequency by configuring the entire tuning amplifier as an integrated circuit. Also, either one of the two phase shifting circuits 110C, 130C may be replaced by the phase shifting circuit 110L or 130L. This will be effective for suppressing fluctuation of the tuning frequency due to variation in temperature.

Incidentally, amplitude fluctuation of the tuning amplifier 1A as shown in FIG. 13 due to adjustment of the tuning frequency is minimized by connecting resistors 22 or 42 to the two phase shifting circuits 110C, 130C in the tuning amplifier 2C shown in FIG. 20. However, in a case of narrow frequency variation, there is little amplitude fluctuation, thereby enabling to constitute the tuning amplifier by eliminating the aforementioned resistors 22, 42. Alternatively, either one of the two resistors 22, 42 may be eliminated from the tuning amplifier.

(Fifth Embodiment)

In the above first to the forth embodiments, loss of the open loop gain of the feedback loop of the circuit including the phase shifting circuits 10C, 30C and the feedback resistor 70 is caused by the input impedance of the front stage phase shifting circuit 10C, etc, In order to reduce the loss due to the input impedance, a follower circuit using a transistor may be interposed at the preceding stage of the front stage phase shifting circuit 10C so that the feedback signal is applied to the front stage phase shifting circuit 10C by way of the follower circuit.

Figure 17:
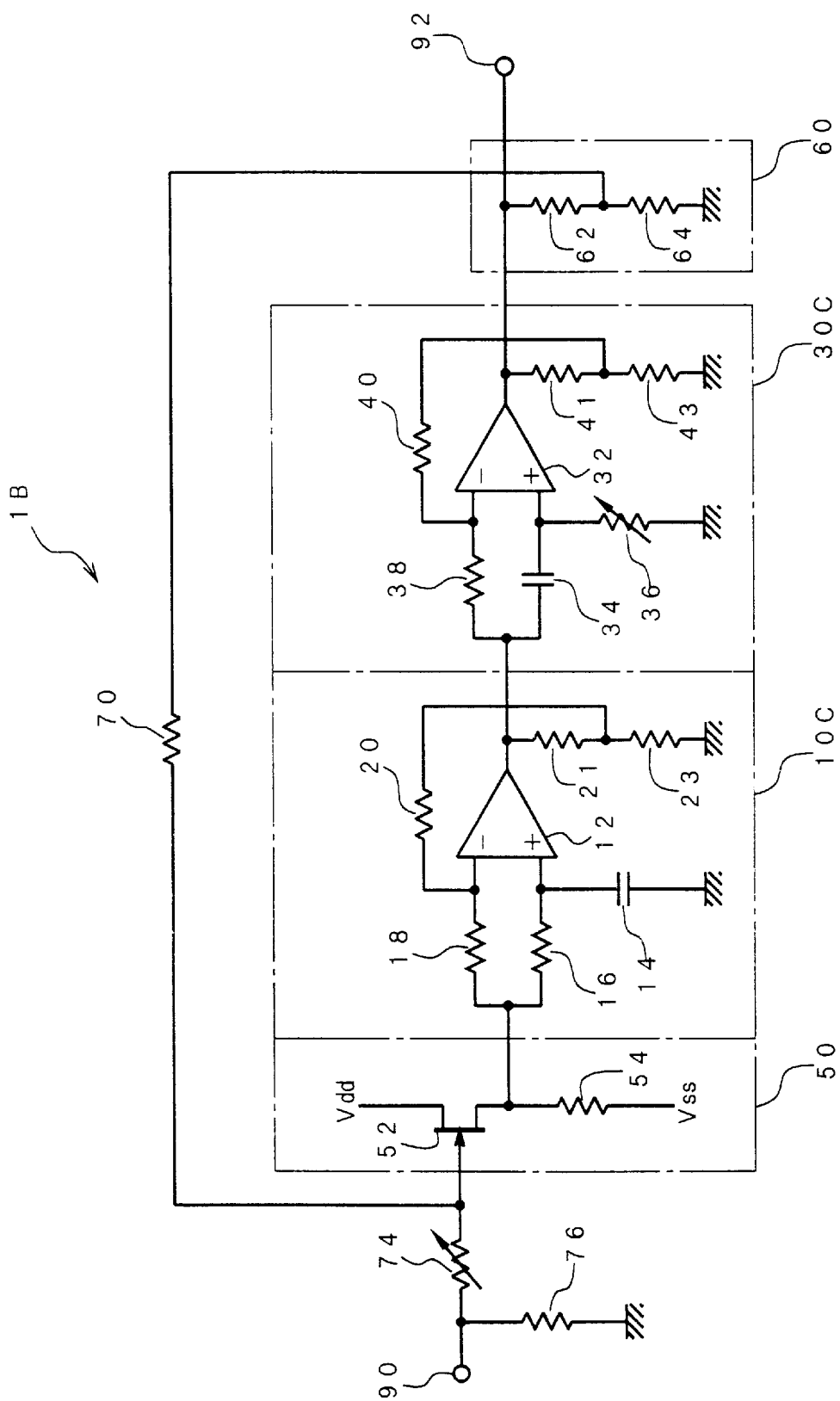
FIG. 17 is a circuit schematic of the tuning amplifier according to the fifth embodiment of the present invention.

Illustrated in FIG. 17 is a circuit schematic to show the principle of the fifth embodiment of the tuning amplifier which is showing the tuning amplifier 1 with the follower circuit 50 interposed at the preceding stage of the front stage phase shifting circuit 10C.

The source follower circuit 50 interposed at the input side of the front stage phase shifting circuit 10C includes an FET (field effect transistor) 52 having the drain connected to a positive power supply Vdd, and the source returned to a negative power supply Vss by way of a source resistor 54. The source follower circuit is constituted by the FET 52 and the resistor 54 and the output from the source follower circuit is fed to the front stage phase shifting circuit 10C. It is to be note that the source follower circuit may be replaced by an emitter follower circuit.

In this manner, if the follower circuit using transistors is connected in cascade to the preceding stage of the front stage phase shifting circuit 10C, the resistance of the feedback resistor 70 and the input resistor 74 can be set higher as compared with the tuning amplifier 1, etc. Particularly, when the tuning amplifier 1 or the like are integrated on semiconductor substrates, an occupied area of elements has to be made larger so that the resistance of the feedback resistor 70, etc. is made smaller. Therefore, it is better for the resistance to be larger to a certain extent. Consequently, the follower circuit worth connecting.

(Other Embodiment)

It is to be understood that the present invention is not restricted to the above embodiments and that various modifications can be made without departing from the scope of the present invention.

In the above described tuning amplifier 1 or the like, the phase shifting circuit 10C or 130C is placed in the front stage and 30C, 130C in the subsequent stage. However, it is possible that the order of arranging the circuit can be replaced because it is only necessary to be equal to 360° phase shift between the input and the output signal by the overall two phase shifting circuits. For example, the phase shifting circuits 30C or 130C may be connected at the front stage and the phase shifting circuits 10C or 110C may be connected at the subsequent stage, respectively.

That is to say, the tuning amplifier of the present invention can be constituted by connecting in cascade and in optional order either one of the phase shifting circuit 10C as shown in FIG. 2, the phase shifting circuit 10L as shown in FIG. 9, the phase shifting circuit 110C as shown in FIG. 13 and the phase shifting circuit 110L as shown in FIG. 15 to either one of the phase shifting circuit 30C as shown in FIG. 4, the phase shifting circuit 30L as shown in FIG. 11, the phase shifting circuit 130C as shown in FIG. 13 and the phase shifting circuit 130L as shown in FIG. 16.

With regard to the one of the two phase shifting circuits connected in cascade, the voltage dividing circuit in the phase shifting circuit may be omitted or the voltage dividing ratio may be set to 1. Similarly, with regard to the other phase shifting circuit in the two phase shifting circuits connected in cascade, the resistor (for example, the resistor 22 as shown in FIG. 13) interposed between the inverting input terminal of the operational amplifier and the earth terminal may be omitted or the resistance of the resistor may be made larger. Also, the follower circuit 50 may be connected to the preceding stage of the front stage phase shifting circuit in the two phase shifting circuits connected in cascade.

Further, the variable resistor 16 or 36 is included in the phase shifting circuit 10C or the like of the above described tuning amplifier 1. The variable resistor 16 or 36 is formed by using, more in detail, a channel resistor of field effect transistor (FET) of junction type or MOS type. If a channel formed between drain and sources of FET is used as a resistor and as a replacement of the variable resistor 16, the amount of the shift can be changed by controlling a gate voltage to be variable and by optionally changing the channel resistance in a certain range.

Also, the variable resistors 16, 36 may be configured using a parallel connection of a p-channel and n-channel FETs. A variable resistor comprising a combination of such FETs helps to improve linearity of the FETs, thereby providing a tuning output with minimum distortion.

Further, the above described phase shifting circuit 10C and so on. are made to change the entire tuning frequency by changing the resistance of the variable resistor 16 or the like connected in series to the capacitor 14 or the like with the phase shift changed as well. However, the entire tuning frequency may be changed as the capacitance of the capacitor 14 and so on.

For example, if the capacitor 14 or the like included in either one of the two phase shifting circuits are replaced by variable capacitance elements and the capacitance thereof is made variable, the tuning frequency can be changed by changing the phase shift of each phase shifting circuit. To be more concrete, the above described variable capacitance element can be formed by a variable capacitance diode wherein a reverse bias voltage impressed between an anode and a cathode is variable or by FET wherein a gate capacitance is made variable. Note that, in order to make the reverse bias impressed to the above described variable capacitance element variable, a DC blocking capacitor may be connected in series to the variable capacitance element.

Also, as described above, in case of other than using the variable resistor or the variable capacitance element, a plurality of resistors, capacitors or inductors of different element constant are provided and, by switching on or off, one or plural thereof may be chosen from a plurality of the elements. In this case, the element constant can be discontinuously changed depending on the number of elements to be connected by switching on or off and the connecting mode thereof (series connection, parallel connection or combination of both connections).

For example, a plurality of resistors of 2 to nth power series such as R, 2R, 4R . . . instead of the variable resistors are prepared and, by choosing and connecting in series one or plural thereof optionally, change in resistance at equal intervals can be easily made by a fewer elements. Similarly, a plurality of capacitors of 2 to nth power series such as C, 2C, 4C . . . instead of the capacitors are prepared and, by choosing and connecting in series one or plural thereof optionally, change in capacitance at equal intervals can be easily made by a fewer elements. Consequently, the tuning amplifier of the present embodiment can be adapted for a circuit with a plurality of the tuning frequency, for example, AM radio and is fit for radio reception by choosing one radio station from a plurality of radio stations.

Further, in the above described amplifier 1, the feedback resistor 70 having a fixed resistance is used as a feedback impedance element and the input resistor 74 having a fixed resistance is used as an input impedance element. However, by forming the constitution of at least the other resistor by a variable resistor, the tuned band width or maximum attenuation in the tuning amplifier 1 may be made variable. Although a highly stable circuit is realized in the above mentioned embodiments by using the phase shifting circuit 10C and 30C, etc. including operational amplifiers, such operational amplifiers in each phase shifting circuit may be replaced by differential input amplifiers having a given amplification factor because offset voltages and voltage gains are not critical in the particular applications such as in the above mentioned embodiments.

Figure 18:
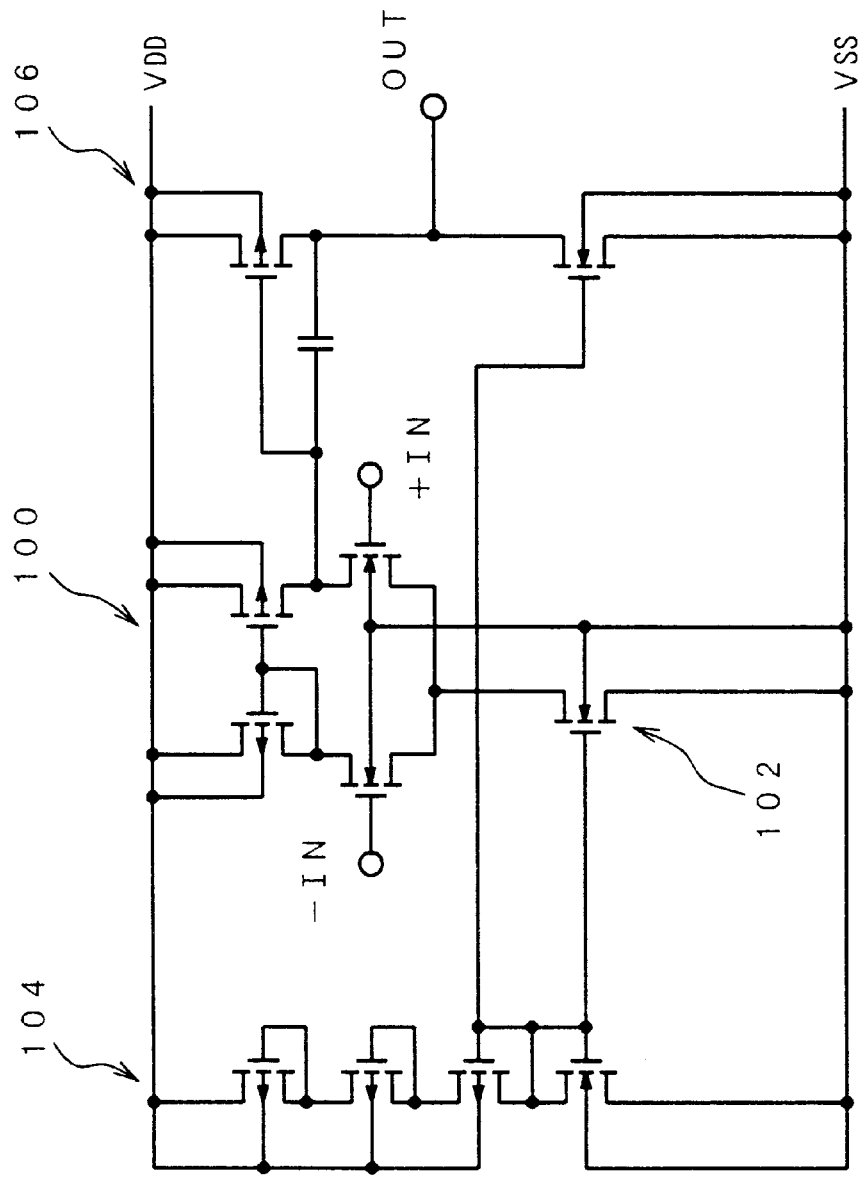
FIG. 18 is a circuit schematic of an important circuit in an operational amplifier operating as a phase shifting circuit.

Now, illustrated in FIG. 18 is a detailed circuit schematic of a circuit portion for phase shift operation in the operational amplifier. This is a differential input amplifier having a predetermined gain. The differential input amplifier in FIG. 18 comprises a differential input stage 100 including FETs, a constant current circuit 102 to provide a constant current to the differential input stage 100, a bias circuit 104 to provide a given bias voltage to the constant current circuit 102, and an output amplifier 106 coupled to the differential input stage 100. As shown in FIG. 18, multi-stage amplifier circuits to acquire a voltage gain in an actual operational amplifier are eliminated to simplify the differential input amplifier, thereby achieving a wide band operation. Such simple circuit helps to increase the upper operation frequency limit and thus increasing the upper limit of the tuning frequency of the tuning amplifier by using such differential input amplifier.

Also, the above described tuning amplifier according to each embodiment takes out a tuned signal by connecting the output terminal 46 of the subsequent stage phase shifting circuit 30C or the like to the output terminal 92 of the tuning amplifier and yet the tuned signal may be also taken out from the front stage phase shifting circuit 10C, etc. or from the follower circuit 50 as shown in FIG. 17. Also, two phase outputs having a predetermined phase difference to each other may be taken out from before and after of the subsequent stage phase shifting circuit 30C, etc. or from before and after of the front stage phase shifting circuit 10C, etc.

Also, in the tuning amplifier 1, 1A as shown in FIG. 1 and FIG. 13, the voltage dividing circuit 60 is connected to the subsequent stage of the phase shifting circuit 30C and yet the voltage dividing circuit 60 may be also interposed between the phase shifting circuits 10C and 30C or before and after of the follower circuit 50. In this case, the output of the voltage dividing circuit 60 may be input to the next stage with the signal before the voltage divided by the voltage dividing circuit 60 taken out as the output of the tuning amplifier.

Possibility of Industrial Applicability

As apparently from the above descriptions according to each of the embodiments, when the tuning amplifier is made variable, there is obtained an almost constant and stable tuned output wherein no amplitude variation arises in a wide range from approximate value to lower limit to approximate value to higher limit. Particularly, by suppressing the variation of an output amplitude at the time when the tuning frequency is made variable, the resistance ratio n of the feedback resistor and the input resistor is made large, thereby Q of the tuning amplifier can be made large.

Also, in the tuning amplifier according to the present invention, since the maximum attenuation is determined by the resistance ratio n of the input impedance element and the feedback impedance element and the tuning frequency is determined by time constant of the CR circuit or the of the LR circuit included in each phase shifting circuit, the maximum attenuation or the tuning frequency and the gain in the tuning frequency can be set without interference therebetween.

Also, the tuning amplifier according to the present invention can perform the tuning operation and the amplifying operation in one circuit at the same time by interposing the voltage dividing circuit in the feedback loop, thereby simplification or the like of the entire system including the tuning amplifier can be realized.

Additionally, the entire tuning circuit can be easily configured as an integrated circuit especially when the pair of phase shifting circuits in each tuning amplifier includes CR circuits. Similarly, if the pair of phase shifting circuits include LR circuits, small inductors may be formed by an integrated circuit technology, thereby providing higher tuning frequencies without any difficulty. In a case of using a CR circuit in one phase shifting circuit while an LR circuit in the other phase shifting circuit, operational performances can be stabilized regardless of temperature and other factors.

I claim:

1. A tuning amplifier comprising:

an adding circuit for adding an input signal and a feedback signal;

two phase shifting circuits of a full band pass type including a differential amplifier wherein an output is returned to the input side; and a voltage dividing circuit interposed into one part of the feedback loop formed by connecting in cascade each of said two phase shifting circuits;

wherein the added signal from said adding circuit is applied to the front stage phase shifting circuit of said two cascade connected phase shifting circuits, the output signal from the subsequent stage phase shifting circuit is applied to said adding circuit as said feedback signal, and wherein portions of an input signal to the front stage phase shifting circuit are provided to an inverting input and portions of the input signal to the front stage phase shifting circuit are provided to a non-inverting input of the differential amplifier front stage phase shifting circuit, and an AC signal input to said voltage dividing circuit is output as a tuned signal.

2. A tuning amplifier comprising:

an adding circuit for adding an input signal and a feedback signal;

two phase shifting circuits of a full band pass type including a differential amplifier wherein an output is returned to the input side; and a voltage dividing circuit interposed into one part of the feedback loop formed by connecting in cascade each of said two phase shifting circuits;

wherein the added signal from said adding circuit is applied to the front stage phase shifting circuit of said two cascade connected phase shifting circuits, the output signal from the subsequent stage phase shifting circuit is applied to said adding circuit as said feedback signal, and an AC signal input to said voltage dividing circuit is output as a tuned signal, and wherein a transistor follower circuit is interposed at the preceding stage of said two cascade connected phase shifting circuits.

3. The tuning amplifier as claimed in claim 1, wherein said differential amplifier comprises an operational amplifier.

4. The tuning amplifier of as claimed in claim 1, wherein all constituent components are integrally formed on a semiconductor substrate.

5. A tuning amplifier comprising:

an adding circuit for adding an input signal applied to one end of an input impedance element and a feedback signal applied to one end of a feedback impedance element; and two phase shifting circuits including a differential amplifier wherein one end of a first resistor is connected to the inverting input terminal and an AC signal is applied by way of said first resistor, a first voltage dividing circuit connected to the output terminal of said differential amplifier, a second resistor interposed between the output terminal of said first voltage dividing circuit and the inverting input terminal of said differential amplifier, and a series circuit constituted by a reactance element using a capacitor or an inductor and a third resistor and connected to the other end of said first resistor, and wherein the junction point of said third resistor and said reactance element is connected to the non-inverting input terminal of said differential amplifier;

wherein each of said two phase shifting circuits are connected in cascade, the added signal from said adding circuit is applied to the front stage phase shifting circuit of said two cascade connected phase shifting circuits, the output signal from the subsequent stage phase shifting circuit is applied to one end of said feedback impedance element as said feedback signal, and the output of either one of the two phase shifting circuits is output as a tuned signal.

6. The tuning amplifier as claimed in claim 5, wherein when said capacitor is included as said reactance element in both of said series circuits or when said inductor is included as said reactance element in both of said series circuits in said two cascade connected phase shifting circuits, the order of the connection of the resistor and said reactance element constituting said series circuit is reversed in said two phase shifting circuits.

7. The tuning amplifier as claimed in claim 5, wherein when said capacitor is included as said reactance element in one of said series circuits and when said inductor is included as said reactance element in the other of said series circuits in said two cascade connected phase shifting circuits, the order of the connection of the resistor and said reactance element constituting said series circuit is same in said two phase shifting circuits.

8. The tuning amplifier as claimed in claim 5, wherein a transistor follower circuit is interposed at the preceding stage of said two cascade connected phase shifting circuits.

9. The tuning amplifier as claimed in claim 5, wherein the second voltage dividing circuit is interposed into a part of the feedback loop formed by said two cascade connected phase shifting circuits and the AC signal input to said second voltage dividing circuit is output as said tuned signal.

10. The tuning amplifier as claimed in claim 5, wherein the tuning frequency is made variable by changing the time constant of at least the one of said series circuits in said two cascade connected phase shifting circuit.

11. The tuning amplifier as claimed in claim 10, wherein said third resistor included in at least the one of said series circuits in said two cascade connected phase shifting circuits is formed by the variable resistor and said time constant is made variable by changing the resistance of the variable resistor.

12. The tuning amplifier as claimed in claim 10, wherein said variable resistor is formed by a parallel connection of p-channel and n-channel FETs to vary the channel resistance depending on the gate voltage.

13. The tuning amplifier as claimed in claim 10, wherein said capacitor included in at least the one of said series circuits in said two cascade connected phase shifting circuits is formed by the variable capacitance element and said time constant is made variable by changing the capacitance of the variable capacitance element.

14. The tuning amplifier as claimed in claim 5, wherein said input and feedback impedance elements are resistors of a variable resistance ratio for controlling the tuning frequency bandwidth and the maximum attenuation.

15. The tuning amplifier as claimed in claim 5, wherein all constituent components are integrally formed on a semiconductor substrate.

16. A tuning amplifier comprising:

an adding circuit for adding an input signal applied to one end of an input impedance element and a feedback signal applied to one end of a feedback impedance element; and two phase shifting circuits including a differential amplifier wherein one end of a first resistor is connected to the inverting input terminal and an AC signal is applied by way of said first resistor, a second resistor interposed between the inverting input terminal and the output terminal of said differential amplifier, a third resistor wherein one end is connected to the inverting input terminal of said differential amplifier and the other end is connected to ground, and a series circuit constituted by a reactance element using a capacitor or an inductor and a fourth resistor and connected to the other end of said first resistor, and wherein the junction point of said fourth resistor and said reactance element is connected to the non-inverting input terminal of said differential amplifier;

wherein each of said two phase shifting circuits are connected in cascade, the added signal from said adding circuit is applied to the front stage phase shifting circuit of said two cascade connected phase shifting circuits, the output signal from the subsequent stage phase shifting circuit is applied to one end of said feedback impedance element as said feedback signal, and the output of either one of the two phase shifting circuits is output as a tuned signal.

17. The tuning amplifier as claimed in claim 16, wherein when said capacitor is included as said reactance element in both of said series circuits or when said inductor is included as said reactance element in both of said series circuits in said two cascade connected phase shifting circuits, the order of the connection of the resistor and said reactance element constituting said series circuit is reversed in said two phase shifting circuits.

18. The tuning amplifier as claimed in claim 16, wherein when said capacitor is included as said reactance element in one of said series circuits and when said inductor is included as said reactance element in the other of said series circuits in said two cascade connected phase shifting circuits, the order of the connection of the resistor and said reactance element constituting said series circuit is same in said two phase shifting circuits.

19. The tuning amplifier as claimed in claim 16, wherein a transistor follower circuit is interposed at the preceding stage of said two cascade connected phase shifting circuits.

20. The tuning amplifier as claimed in claim 16, wherein a voltage dividing circuit is interposed into a part of the feedback loop formed by said two cascade connected phase shifting circuit and the AC signal input to said voltage dividing circuit is output as said tuned signal.

21. The tuning amplifier as claimed in claim 16, wherein the tuning frequency is made variable by changing the time constant of at least the one of said series circuits in said two cascade connected phase shifting circuit.

22. The tuning amplifier as claimed in claim 21, wherein said fourth resistor included in at least the one of said series circuits in said two cascade connected phase shifting circuit is formed by the variable resistor and said time constant is made variable by changing the resistance of the variable resistor.

23. The tuning amplifier as claimed in claim 21, wherein said variable resistor is formed by a parallel connection of p-channel and n-channel FETs to vary the channel resistance depending on the gate voltage.

24. The tuning amplifier as claimed in claim 21, wherein said capacitor included in at least the one of said series circuits in said two cascade connected phase shifting circuit is formed by the variable capacitance element and said time constant is made variable by changing the capacitance of the variable capacitance element.

25. The tuning amplifier as claimed in claim 16, wherein said input and feedback impedance elements are resistors of a variable resistance ratio for controlling the tuning frequency bandwidth and the maximum attenuation.

26. The tuning amplifier of either one of claim 16, wherein all constituent components are integrally formed on a semiconductor substrate.

27. A tuning amplifier comprising:

an adding circuit for adding an input signal applied to one end of an input impedance element and a feedback signal applied to one end of a feedback impedance element;

a first phase shifting circuit including a differential amplifier wherein one end of a first resistor is connected to the inverting input terminal and an AC signal is applied by way of said first resistor, a first voltage dividing circuit connected to the output terminal of said differential amplifier, a second resistor interposed between the output terminal of said first voltage dividing circuit and the inverting input terminal of said differential amplifier, and a series circuit constituted by a reactance element using a capacitor or an inductor and a third resistor and connected to the other end of said first resistor, and wherein the junction point of said third resistor and said reactance element is connected to the non-inverting input terminal of said differential amplifier; and a second phase shifting circuit including a differential amplifier wherein one end of a fourth resistor is connected to the inverting input terminal and an AC signal is applied by way of said fourth resistor, a fifth resistor interposed between the inverting input terminal and the output terminal of said differential amplifier, a sixth resistor wherein one end is connected to the inverting input terminal of said differential amplifier and the other end is connected to ground, and a series circuit constituted by a reactance element using a capacitor or an inductor and a seventh resistor and connected to the other end of said fourth resistor, and wherein the junction point of said seventh resistor and said reactance element is connected to the non-inverting input terminal of said differential amplifier;

wherein said first and second phase shifting circuits are connected in cascade, the added signal from said adding circuit is applied to the front stage phase shifting circuit of said two cascade connected phase shifting circuits, the output signal from the subsequent stage phase shifting circuit is applied to one end of said feedback impedance element as said feedback signal, and the output of either one of said first and second phase shifting circuits is output as a tuned signal.

28. The tuning amplifier as claimed in claim 27, wherein when said capacitor is included as said reactance element in both of said series circuits or when said inductor is included as said reactance element in both of said series circuits in said two cascade connected phase shifting circuits, the order of the connection of the resistor and said reactance element constituting said series circuit is reversed in said two phase shifting circuits.

29. The tuning amplifier as claimed in claim 27, wherein when said capacitor is included as said reactance element in one of said series circuits and when said inductor is included as said reactance element in the other of said series circuits in said two cascade connected phase shifting circuits, the order of the connection of the resistor and said reactance element constituting said series circuit is same in said two phase shifting circuits.

30. The tuning amplifier as claimed in claim 27, wherein a transistor follower circuit is interposed at the preceding stage of said two cascade connected phase shifting circuits.

31. The tuning amplifier as claimed in claim 27, wherein a second voltage dividing circuit is interposed into a part of the feedback loop formed by said two cascade connected phase shifting circuit and the AC signal input to said second voltage dividing circuit is output as said tuned signal.

32. The tuning amplifier as claimed in claim 27, wherein the tuning frequency is made variable by changing the time constant of at least the one of said series circuits in said two cascade connected phase shifting circuit.

33. The tuning amplifier as claimed in claim 32, wherein a resistor included in at least the one of said series circuits in said two cascade connected phase shifting circuit is formed by the variable resistor and said time constant is made variable by changing the resistance of the variable resistor.

34. The tuning amplifier as claimed in claim 32, wherein a resistor included in at least the one of said series circuits in said two cascade connected phase shifting circuit is formed by the FET channel and a channel resistance is made variable by changing the gate voltage.

35. The tuning amplifier as claimed in claim 32, wherein said capacitor included in at least the one of said series circuits in said two cascade connected phase shifting circuit is formed by the variable capacitance element and said time constant is made variable by changing the capacitance of the variable capacitance element.

36. The tuning amplifier as claimed in claim 27, wherein said input and feedback impedance elements are resistors of a variable resistance ratio for controlling the tuning frequency bandwidth and the maximum attenuation.

37. The tuning amplifier of either one of claim 27, wherein all constituent components are integrally formed on a semiconductor substrate.

* * * * *